United States Patent [19]
Nishida et al.

[11] Patent Number: 5,457,436
[45] Date of Patent: Oct. 10, 1995

[54] BALANCED PHASE MODULATOR USED IN MICROWAVE BAND

[75] Inventors: Masakazu Nishida; Shinichi Ohmagari; Osamu Yamamoto, all of Tokyo, Japan

[73] Assignee: NEC Corporation, Japan

[21] Appl. No.: 311,601

[22] Filed: Sep. 23, 1994

[30] Foreign Application Priority Data

Sep. 24, 1993 [JP] Japan .................. 5-237869

[51] Int. Cl.⁶ .................. H03C 3/08; H04L 27/20
[52] U.S. Cl. .................. 332/146; 455/42; 455/111
[58] Field of Search .................. 332/103, 105, 332/130, 144, 146; 455/42, 110, 111; 375/52, 67

[56] References Cited

U.S. PATENT DOCUMENTS 4,355,289  10/1982  Beyer et al. .................. 332/105
4,453,257   6/1984  Lo et al. .................. 332/144

FOREIGN PATENT DOCUMENTS 57-155865  9/1982  Japan .

Primary Examiner—Siegfried H. Grimm
Attorney, Agent, or Firm—Ostrolenk, Faber, Gerb & Soffen

[57] ABSTRACT

A phase modulator for a microwave band having a desirable modulation characteristic by maintaining the impedance thereof constant, includes two PIN diodes 2 and 3 connected to a merchant balun 1 and a bias circuit 18 which supplies bias voltages to the PIN diodes 2 and 3 such that the sum of the bias voltages applied to the diodes 2 and 3 is constant. The bias voltages are selected so as to have the input and output impedances to be in the most stable state when a modulation signal is equal to zero.

9 Claims, 4 Drawing Sheets

FIG. 2(a)
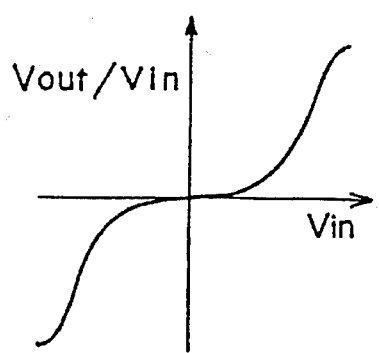
FIG. 2(b)
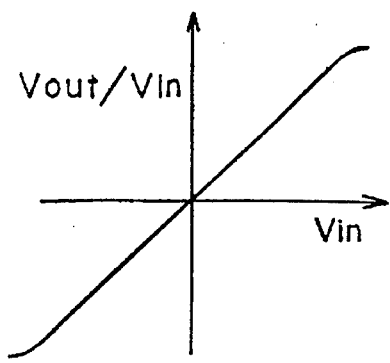
FIG. 2(c)
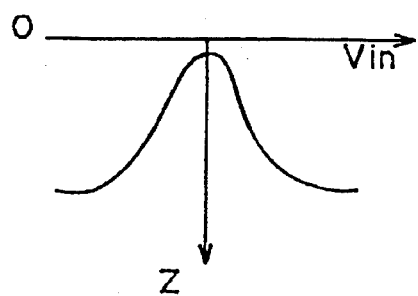
FIG. 2(d)
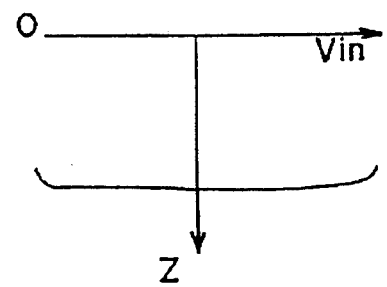
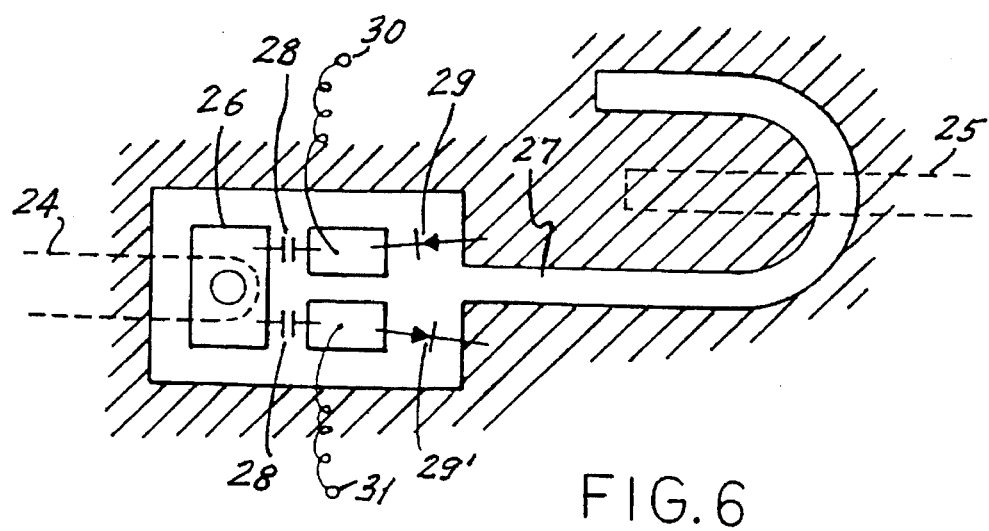
FIG. 6

BALANCED PHASE MODULATOR USED IN MICROWAVE BAND

BACKGROUND OF THE INVENTION

This invention relates to a balanced phase modulator used in the microwave band (1 to 100 GHz).

Conventionally, a phase modulator for microwave band of 1 to 100 GHz has a circuit configuration as shown in FIG. 4, for example. In this figure, a modulation signal terminal 19 is provided by connecting diodes 20 and 20' to a branch line 3 dB hybrid 21 equipped with an input terminal 22 and an output terminal 23. In this phase modulator, a microwave signal entering from the input terminal 22 enters the branch line 3 dB hybrid 21 to be subjected to modulation provided by the diodes 20 and 20'. Ordinarily, Schottky barrier diodes are used for the diodes 20 and 20'. Such conventional phase modulator is disclosed in Japanese Laid-open Patent Application No. 57-155865 (published Sep. 27, 1982).

FIG. 5 is a diagram showing the modulation characteristic of the phase modulator of FIG. 4 in terms of the relation between the modulation voltage Vm and the output signal voltage Vout. In this phase modulator, if it is used in the range of small value of the modulation voltage Vm, then it operates as a linear modulator according to the modulation characteristic.

In the conventional phase modulator shown in FIG. 4, therefore, there is a drawback that a signal loss becomes significant because it must be used in the range where the modulation voltage is small. In addition, the maximum input power for the modulator is a low value of +10 dBm because of the use of the Schottky barrier diodes for the diodes in the circuit, and its output power becomes of the order of −5 dBm. Accordingly, it is necessary to increase the number of stages of amplification in order to obtain a desired output power. However, such an increase in the number of amplification stages brings about a complication of the circuit configuration, and high cost. Moreover, there is a problem in that the output power level is too low and it is difficult to maintain a circuit impedance as a whole at a constant level. The Japanese Laid-open Patent Application No. 57-155865 also shows another circuit configuration which includes an input terminal 24, an output terminal 25, a coplanar converter 26, a slot line 27, DC cutting capacitors 28, PIN diodes 29 and 29', a modulation signal-and-fixed bias input terminal 30 and a fixed bias input terminal 31. In this figure, one PIN diode 29 receives a modulation signal and a fixed bias voltage and the other diode 29' receives a fixed bias voltage, as shown FIG. 6.

According to the circuit configuration of FIG. 6, a high output power level can be obtained by applying the PIN diodes. However, modulation linearity is not so desirable since respective characteristics of the PIN diodes are varied while operating. Further, a C/N ratio of a modulation output is low due to impedance change of the PIN diodes.

SUMMARY OF THE INVENTION

It is an object of the invention to provide a phase modulator for microwave band having desirable modulation linearity.

It is another object of the invention to provide a phase modulator capable of keeping impedance at a constant value.

According to the invention, there is provided a phase modulator for a microwave band, comprising a balance-to-unbalance transformer part, two diodes connected to the balance-to-unbalance transformer part and a bias circuit which applies bias voltages to the two diodes in such a way that the sums of the respective voltages are constant.

In detail, a phase modulator for microwave band of the invention comprises a balance-to-unbalance transformer part, two diodes connected to the balance-to-unbalance transformer part, first superposition application means which applies a bias voltage and a modulation signal to one of the two diodes, and second superposition application means which applies the bias voltage and a phase-inverted modulation signal to the other of the two diodes, wherein the bias signal is so selected as to give a stable state to the input or output impedance when the modulation signal is equal to zero.

BRIEF DESCRIPTION OF THE DRAWINGS

FIG. 2(a) shows the relation between an input voltage and a ratio of output voltage/input voltage prior to the modulation;

FIG. 2(b) shows the relation between an input voltage and a ratio of output voltage/input voltage during modulation according to the present invention;

FIG. 2(c) shows an impedance characteristic prior to the modulation;

FIG. 2(d) shows an impedance characteristic during the modulation;

FIG. 6 a circuit diagram of another conventional phase modulator.

DESCRIPTION OF THE EMBODIMENTS

Figure 1:
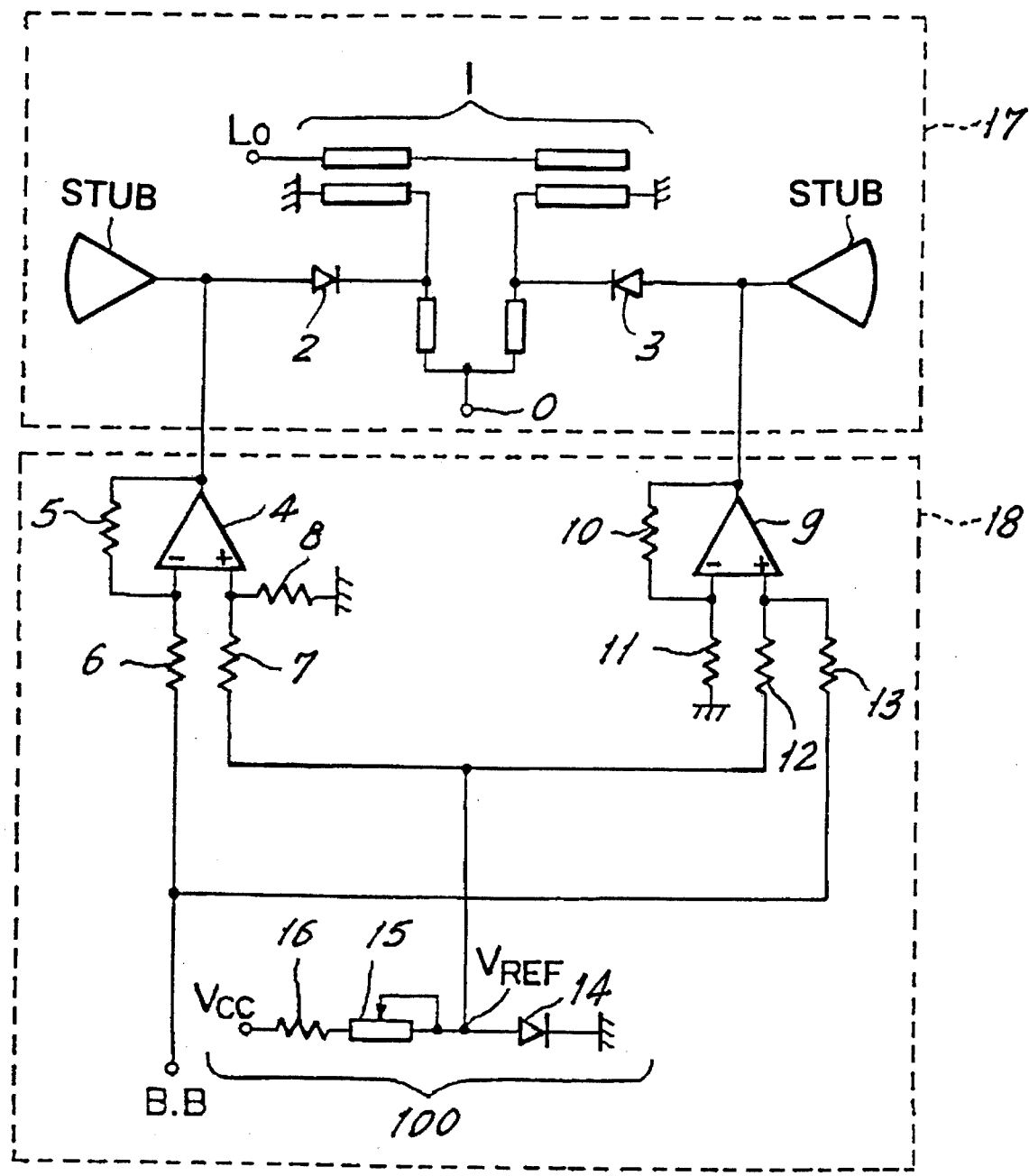
FIG. 1 is a circuit diagram illustrating a first embodiment of the present invention.

Referring to FIG. 1, an embodiment of the phase modulator for a microwave band according to this invention comprises a phase modulator circuit 17 including a merchant balun (passive distributed constant circuit) 1 as a balance-to-unbalance transformer part, and a bias circuit 18 connected to the phase modulator circuit 17.

The phase modulator circuit 17 has, in addition to the merchant balun 1, two PIN diodes 2 and 3 that are connected to the balun 1 so as to have mutually the same polarity in this case. These PIN diodes 2 and 3 are connected to an output terminal O.

The bias circuit 18 has an operational amplifier 4 whose output terminal is connected to the PIN diode 2, an operational amplifier 9 whose output terminal is connected to the PIN diode 3, a feedback resistor 5 connected between the output terminal and the inverting input terminal of the operational amplifier 4, a feedback resistor 10 connected between the output terminal and the inverting input terminal of the operational amplifier 9, a signal input terminal B.B. which is connected to the inverting input terminal of the operational amplifier 4 via an input resistor 6, and to the noninverting input terminal of the operational amplifier 9 via an input resistor 13, a grounding resistor 8 which connects the noninverting input terminal of the operational amplifier 4 and the ground, a grounding resistor 11 which connects the inverting input terminal of the operational amplifier 9 and the ground, and a voltage application circuit 100 which is connected to the noninverting input terminal of the operational amplifier 4 via an input resistor 7, and to the noninverting input terminal of the operational amplifier 9 via an input resistor 12.

The voltage application circuit 100 is formed by connecting in series a resistor 16 connected to a voltage application terminal Vcc, a PIN diode 14 connected to the ground, and a variable resistor 15 disposed between them. Incidentally, the input resistors 7 and 12 are connected between the PIN diode 14 and the variable resistor 15. Here, the PIN diodes 2, 3 and 14 have an output voltage level characteristic which is higher than that of a Schottky barrier diode.

In this embodiment, the modulation signal input terminal B.B, the voltage application circuit 100, the operational amplifier 9 and the input resistors 12 and 13 act as a superposing arrangement which superposes a bias voltage and a modulation signal to the diode 3, namely, as the first superposition application means. Similarly, the signal input terminal B.B, the voltage application circuit 100, the operational amplifier 4 and the input resistors 6 and 7 act as another superposing arrangement which superposes the bias voltage and the phase-inverted modulation signal obtained by inverting the phase of the modulation signal to the diode 2, namely, as the second superposition application means. Here, the bias voltage applied by the voltage application circuit 100 is regulated and fixed so as to give input and output impedances for the circuit as a whole the most stable state when the modulation signal is equal to zero.

In FIG. 1, a RF (radio frequency) signals which is input to the input terminal $L_0$ of the merchant balun 1 enters the PIN diodes 2 and 3 after its phase is inverted by the merchant balun 1. A modulation (baseband) signal $V_{BB}$ which enters the system from the signal input terminal B.B is given from the bias circuit 18 to the phase modulation circuit 17. The RF signal which passed the PIN diodes 2 and 3, and the modulation signal $V_{BB}$ from the bias circuit 18 are multiplied and the result is output from the output terminal O in the phase modulation circuit 17.

In the voltage application circuit 100, a reference voltage (bias voltage) $V_{REF}$ is derived through the resistor 16 and the variable resistor 15 from the voltage applied to the voltage application terminal $V_{CC}$ and supplied to the operational amplifiers 4 and 9. Thus, the output power of the operational amplifier 4 becomes $-(V_{REF}-V_{BB})$, and the output voltage of the operational amplifier 9 becomes $-(V_{REF}+V_{BB})$, and the sum of the output voltages of the bias circuit 18 is constant. This means that the sum of voltages applied to the diodes 2 and 3 becomes constant and, thus means that product of equivalent resistance values of the diodes 2 and 3 is constant.

Accordingly, by applying such bias voltages, it is possible to change the relation between the input voltage (Vin) and the ratio (Vout)/(Vin) between the output voltage (Vout) and the input voltage (vin), shown by the curve in FIG. 2(a) to the relation of a desired proportionality line (having a prescribed slope) as shown in FIG. 2(b). Further, the impedance Z at the time of modulation can also be changed from the bell-shaped curve shown in FIG. 2(c) to a straight line with zero slope (showing that the signal loss is extremely small) as shown in FIG. 2(d), making it possible to maintain the impedance Z at a constant level.

Figure 3:
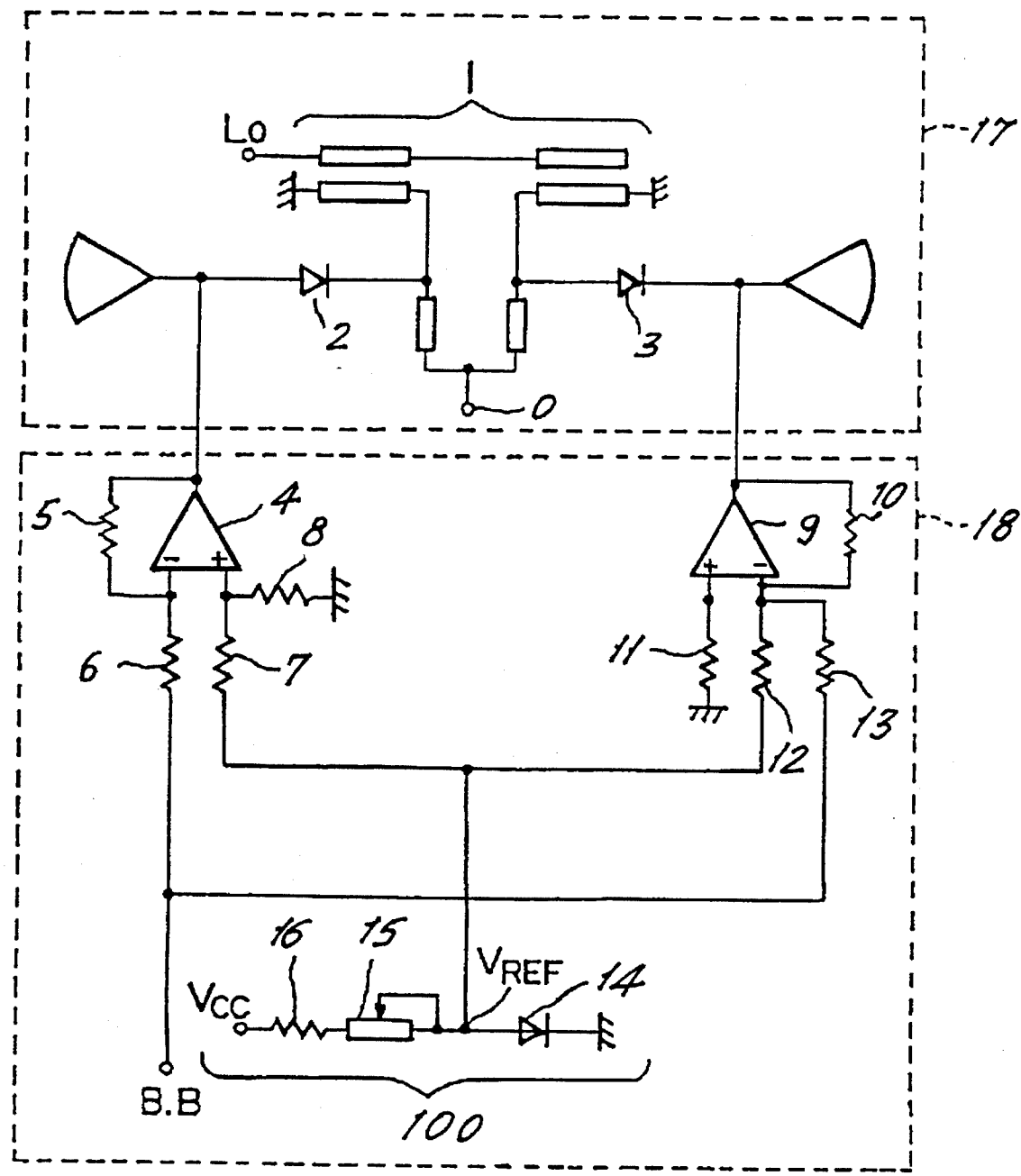
FIG. 3 is a circuit diagram illustrating a second embodiment of the present invention.
Figure 4:
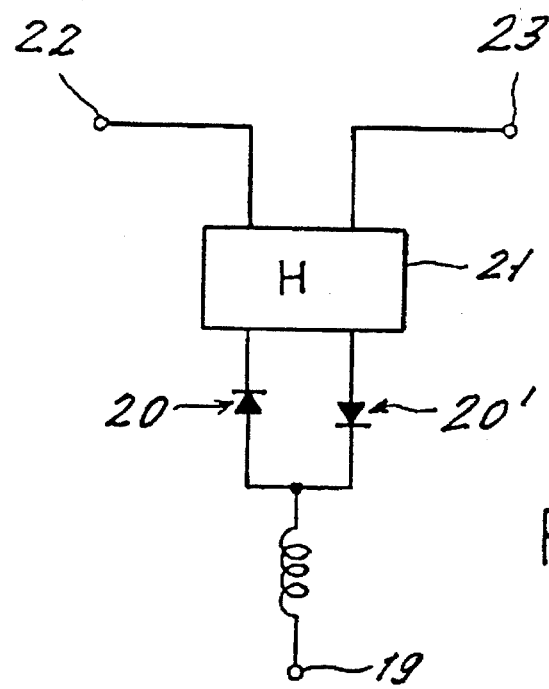
FIG. 4 is a circuit diagram of a conventional phase modulator for a microwave band.
Figure 5:
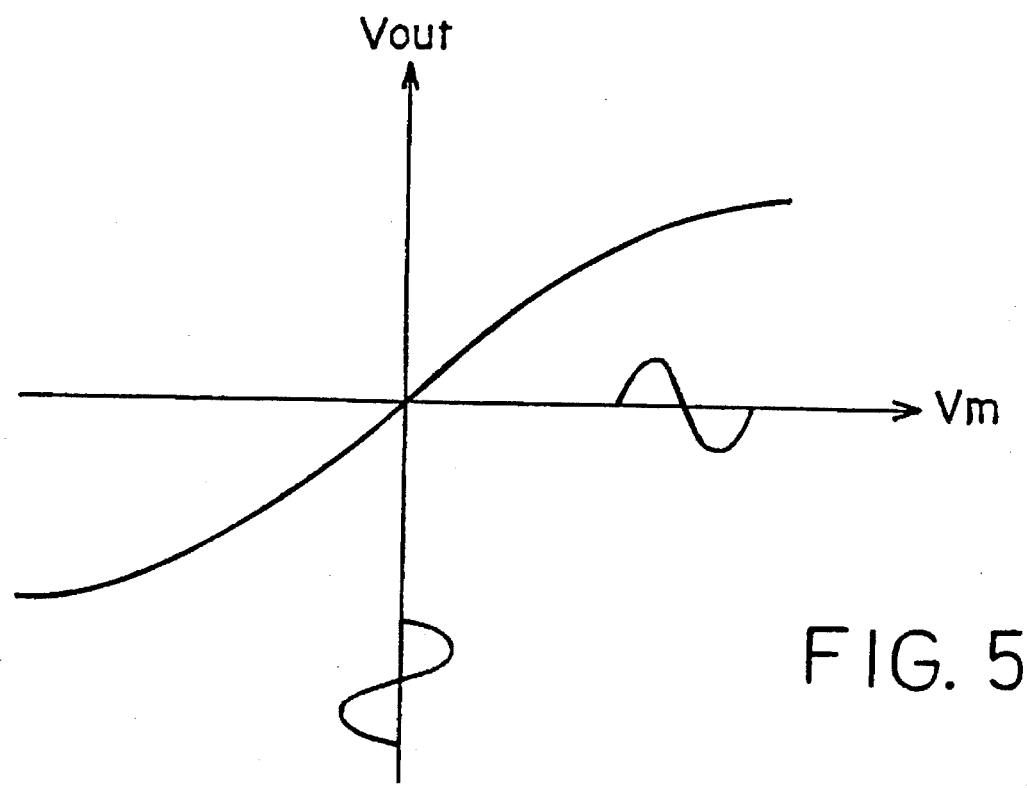
FIG. 5 shows a modulation characteristic according to the conventional phase modulator shown in FIG. 4.

In the embodiment described above, the PIN diodes 2 and 3 are assumed to be connected to the merchant balun 1 so as to have mutually the same polarity. However, effect similar to the above can also be obtained when these PIN diodes 2, and 3 are connected to the merchant balun so as to have mutually opposite polarities, and the polarities of the operational amplifiers 4 and 9 are designated to match the polarities of the PIN diodes 2 and 3. FIG. 3 shows a circuit diagram of this embodiment.

As described above, according to the present invention, by applying the PIN diodes in the phase modulation circuit and the bias circuit keeping the voltage sum added to the two diodes constant, the phase modulator having small signal loss, constant impedance and the desirable modulation characteristic of the straight line is obtained with the simple circuit configuration. Moreover, according to the present invention, by keeping impedance of the PIN diode arrangement at an optimal value, it is possible to prevent harmful influence, i.e., deterioration of the C/N ratio in the modulation output, derived from load variation of a local frequency oscillation part.

What is claimed is:

1. A phase modulator for a microwave band comprising:
   a transformer receiving a carrier signal;
   two diodes connected to said transformer each receiving a modulation signal; and
   a bias circuit for applying bias voltages to said two diodes such that the sum of the bias voltages is kept constant.

2. A phase modulator as claimed in claim 1, wherein said transformer is a balance-to-unbalance type transformer, and said two diodes are connected to said transformer in a manner to have mutually the same polarities, said phase modulator further comprising a first means for applying one of said bias voltages and said modulation signal to one of said two diodes and a second means for applying the other bias voltage and a phase-inverted modulation signal produced from said modulation signal to the other diode.

3. A phase modulator as claimed in claim 1, wherein said transformer is a balance-to-unbalance type transformer and said two diodes are connected to said transformer in a manner to have opposite polarities, said phase modulator further comprising a first means for applying one of said bias voltages and said modulation signal to one of said two diodes and a second means for applying the other bias voltage and a phase-inverted modulation signal produced from said modulation signal to the other diode.

4. A phase modulator as claimed in claim 1, wherein said bias circuit includes a series of a variable resistor and a third diode.

5. A phase modulator as claimed in claim 4, wherein said two diodes and third diode are PIN diodes.

6. A phase modulator as claimed in claim 2, wherein said first and second applying means include an operational amplifier receiving said bias voltage and modulation signal.

7. A phase modulator as claimed in claim 2, wherein said balance-to-unbalance type transformer is a merchant balun.

8. A phase modulator as claimed in claim 3, wherein said first and second applying means include an operational amplifier receiving said bias voltage and modulation signal.

9. A phase modulator as claimed in claim 3, wherein said balance-to-unbalance type transformer is a merchant balun.

* * * * *